(12) United States Patent
Nakae

(10) Patent No.: US 6,849,931 B2
(45) Date of Patent: Feb. 1, 2005

(54) LEAD FRAME

(75) Inventor: Katsuya Nakae, Yukuhashi (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/164,529

(22) Filed: Jun. 7, 2002

(65) Prior Publication Data

US 2002/0185713 A1 Dec. 12, 2002

(30) Foreign Application Priority Data

Jun. 11, 2001 (JP) .................................. 2001-176041

(51) Int. Cl.$^7$ ............................................ H01L 23/495
(52) U.S. Cl. ..................................... 257/672; 257/676
(58) Field of Search .............................. 257/672, 676, 257/666; 438/123, 125

(56) References Cited

U.S. PATENT DOCUMENTS

| | | | | |
|---|---|---|---|---|
| 5,753,535 A | * | 5/1998 | Ebihara | .................. 216/14 |
| 6,025,650 A | * | 2/2000 | Tsuji et al. | .................. 257/786 |
| 6,483,178 B1 | * | 11/2002 | Chuang | ..................... 257/672 |
| 6,548,328 B1 | * | 4/2003 | Sakamoto et al. | .......... 438/121 |
| 2002/0121684 A1 | * | 9/2002 | Kobayakawa | ............... 257/676 |

* cited by examiner

*Primary Examiner*—Phat X. Cao
(74) *Attorney, Agent, or Firm*—Jordan and Hamburg LLP

(57) ABSTRACT

A lead frame for semiconductor electronic parts with a landed semiconductor chip has a body part formed with a molding resin by landing the semiconductor chip on an island, connecting a plurality of leads to respective electrode pads of the semiconductor chip via conductors and sealing the semiconductor chip with the molding resin and a junction to a mounted board formed by exposing the lower faces of the leads to the lower face of the body. Recessed mold resin engaging cavities are provided at both side faces of each of the leads. Otherwise, each of the leads is formed in inverted trapezoidal cross section, with its upper face being wider than its lower face. Protruded thrust extension members which make the lower faces of the leads extend to the extending direction of the leads and which are thinner than the leads are provided at the end of each of the leads.

2 Claims, 2 Drawing Sheets

LEAD FRAME

BACKGROUND OF THE INVENTION

1. Field of the Invention

The present invention relates generally to a lead frame for semiconductor electronic parts, and more particularly to a lead frame in use for semiconductor electronic parts called a QFN (Quad Flatpack Non-leaded) package.

2. Description of Related Art

Conventionally, a lead frame has been formed with an island to land a semiconductor chip thereon and a plurality of leads to be connected to respective electrode pads of the semiconductor chip landed on the island via metal wires as conducting means by applying die-cutting and etching processes to a thin metal plate extending in one direction. Semiconductor electronic parts have been formed by landing the semiconductor chip on the island of the formed lead frame using a die-bonding agent, electrically connecting the given leads to the respective electrode pads of the semiconductor chip using metal wires of gold or aluminum and molding the semiconductor chip to be sealed with a molding resin, followed by cutting the leads extending from a body part formed with the molding resin at predetermined lengths in order to separate the semiconductor chip sealed with the molding resin from the lead frame.

After separation from the lead frame, the leads have been shaped as required. Besides, predetermined plated coatings have been arranged on the connections of the leads to be connected to connection terminals provided on a mounted board.

The semiconductor electronic parts produced using such lead frames include those in the form called a QFN (Quad Flatpack Non-leaded) package.

The QFN semiconductor electronic parts have involved exposing the lower faces of leads to the lower face side of the approximately rectangular body part formed with the molding resin in almost the same plane as the lower face thereof and preventing the leads from extending from the body part by cutting the leads along the outer periphery of the body part.

Thus, the product dimension of the QFN semiconductor electronic parts could be reduced in proportion as the leads did not extend from the body part, and the mounting efficiency of the mounted board could be enhanced.

OBJECTS OF THE PRESENT INVENTION

Such QFN semiconductor electronic parts have created problems. Namely, as typically shown in FIG. 4, in a molding process for sealing a semiconductor chip (c) with a molding resin, where a molding space 30 to fill the molding resin therein has been formed while holding a lead frame between a male mold 10 and a female mold 20, thrusting means could not been provided therein for thrusting the ends of leads 40 inserted into the molding space 30 against the upper face of the female mold 20 and the ends of the leads have been easily warped up by stress resulting from thrust on the leads 40 held between the male mold 10 and the female mold 20, which has caused gaps to be formed between the lower face of the lead 40 and the upper face of the female mold 20 and resin burrs to be easily formed by the entry of the molding resin filled in the molding space into the gaps.

The resin burrs formed have induced a plating liquid or a washing liquid to easily reside in gaps between the resin burr and the lead in the following plating process, leading to staining after plating or incomplete mounting during mounting on a mounted board. Therefore, the resin burrs should have been removed, resulting in an increase in production cost.

In FIG. 4, reference numeral 50 is an island to land the semiconductor chip (c) thereon and reference numeral 60 is a metal wire for electrically connecting an electrode pad of the semiconductor chip (c) and the lead 40.

It is a general object of the present invention to provide a lead frame for preventing the formation of the resin burrs by thrusting the ends of the leads against the upper face of the female mold 20 using the pressure of the molding resin pressed into the molding space in the molding process.

SUMMARY OF THE INVENTION

According to one aspect of the present invention, a lead frame for semiconductor electronic parts comprises an island adapted to land a semiconductor chip thereon and a plurality of leads provided around the peripheral edge of the island and adapted to be connected to respective electrode pads of the semiconductor chip landed on the island via conducting means, the lead frame having a body part formed with the molding resin by landing the semiconductor chip on the island, electrically connecting the leads to the respective electrode pads of the semiconductor chip via the conducting means and sealing the semiconductor chip with the molding resin and a junction part to a mounted board formed by exposing the lower faces of the leads to the lower face of the body part, wherein recessed molding rein engaging cavities are provided at both side faces of each of the leads to form each of the leads in approximately laid H-shape cross section.

According to another aspect of the present invention, each of the leads is formed in inverted trapezoidal cross section with its upper face being wider than its lower face.

According to another aspect of the present invention, protruded thrust extension members which make the lower faces of the leads extend in the extending direction of the leads and which are thinner than the leads are provided at the end of each of the leads.

DISCLOSURE OF THE INVENTION

Figure 1:
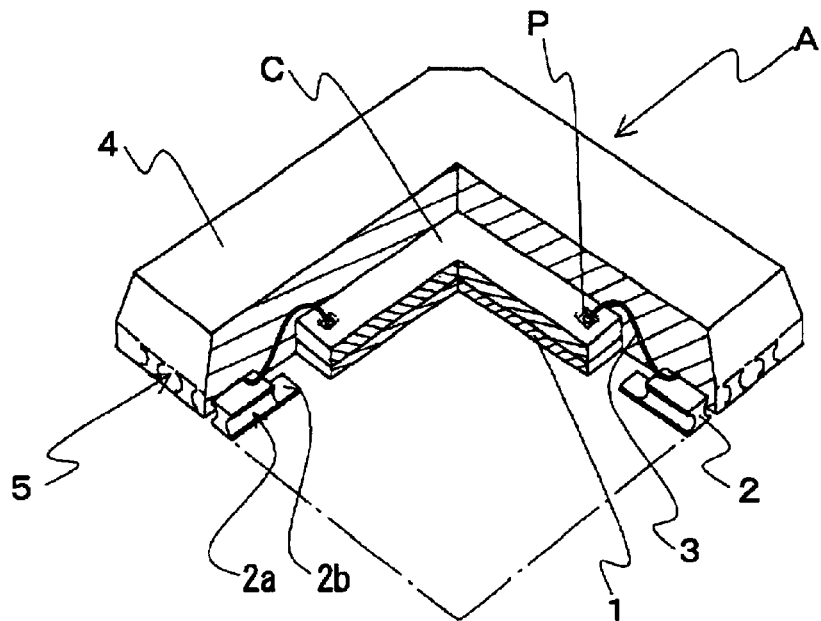
FIG. 1 is a partially cut-away view in perspective of a QFN semiconductor electronic parts using a lead frame according to the present invention.

The lead frame of the invention has the protruded molding resin engaging cavities provided at both side faces of each of the leads which are arranged around the island and embedded in the molding resin with their lower faces being exposed. The protruded molding rein engaging cavities are provided to form the leads in approximately 90°-laid H-shape cross section.

Since the molding resin engaging cavities are provided, in a molding process for sealing the semiconductor chip with the molding resin, where the melted molding resin is pressed into a molding space formed by a male mold and a female mold, the molding resin is also pressed in the molding resin engaging cavities and the pressed-in molding resin operates to push the leads down. Therefore, the formation of gaps between the lower face of the lead and the upper face of the female mold is suppressed and the formation of resin burrs is prevented.

Namely, a pressure, when applied to the melted molding resin to be pressed therein, is a hydrostatic pressure which operates uniformly to all directions while elastic force resulting from the plasticity of the leads themselves operates on thick portions of the leads, whereby the pressure during press-in tends to be balanced at the thick portions of the leads. However, since the molding resin engaging cavities are provided to form thin portions at the lower face sides of the leads, there are no force of pushing the lower faces of the leads up at the thin portions and no factor of balancing the pressure applied to the molding resin. Therefore, the force of pushing the leads down can be generated by the pressure of the molding resin filled in the molding resin engaging cavities.

Furthermore, since the recessed molding resin engaging cavities are provided at both side faces of each of the leads, the molding resin and the leads can be put in an each other engaging condition after the molding resin is hardened and so adherence between the lead and the molding resin can be improved.

It is also acceptable that each of the leads of the lead frame of the invention is formed in inverted trapezoidal cross section instead of laid H-shape cross section, with its upper face being wider than its lower face.

Since each of the leads has the upper face wider than the lower face, in the molding process for sealing the semiconductor chip with the molding resin, where the melted molding resin is pressed in the molding space formed by the male mold and the female mold, the molding resin itself becomes a resistant fluid to preclude the upward movement of the larger-area upper faces of the leads, with the result that the leads are positively pushed down to suppress the formation of gaps between the lower face of the lead and the upper face of the female mold and thus prevent the formation of resin burrs.

Since each of the leads is formed in inverted trapezoidal cross section with its upper face being wider than its lower face, the leads serve as tenons to be fitted into mortises formed by the molding resin after the molding resin is hardened. Therefore, adherence between the lead and the molding resin is improved.

The procedure of forming each of the leads in inverted trapezoidal cross section is easier than that of forming it in laid H-shape cross section. In particular, the leads, if arranged at small pitches, can be accurately formed in inverted trapezoidal cross section. It is, therefore, desirable that the leads for the QFN semiconductor electronic parts requiring the leads to be spaced at small pitches have the inverted trapezoidal cross section.

Protruded thrust extension members which make the lower faces of the leads extend in the extending direction of the leads and which are thinner than the leads are provided at the end of each of the leads formed in laid H-shape cross section or inverted trapezoidal cross section, as described above.

Since the thrust extension members are provided, in the molding process for sealing the semiconductor chip with the molding resin, where the molding resin is pressed therein, the thrust extension members positively adhere to the surface of the female mold to prevent the formation of the resin burrs.

Figure 4:
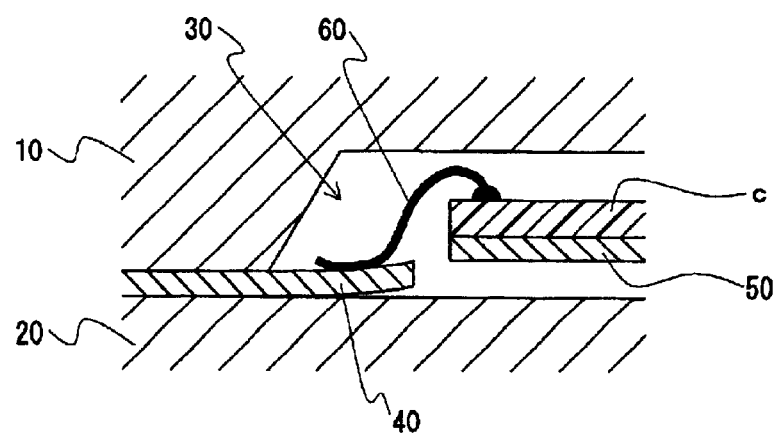
FIG. 4 is an explanatory view showing a pressed-in condition of a conventional molding resin.

Namely, as shown in FIG. 4, although the leads are generally the easiest to isolate at their ends from the upper face of the female mold and so the resin burrs are the easiest to form at the ends of the leads, the thin thrust extension members provided at the end of each of the leads are easily deflected and pushed down by the molding resin concurrently with the press-in of the molding resin, and they can adhere to the upper face of the female mold without producing a clearance, while being easily deflected. As a result, the formation of the resin burrs is prevented.

DETAILED DESCRIPTION OF PREFERRED EMBODIMENTS

Referring now to the drawings, more specific embodiments are detailed.

FIG. 1 is a partially cut-away view in perspective of QFN semiconductor electronic parts A using a lead frame according to this invention. The QFN semiconductor electronic parts A are formed with the lead frame comprising an island 1 and a plurality of leads 2, by landing a semiconductor chip C on the island, wire-bonding the given leads 2 to respective electrode pads P of the semiconductor chip C using metal wires such as gold wires 3 in this embodiment and then sealing the semiconductor chip C with a molding resin 4. Herein, wire-bonding using the gold wires 3 serves as conducting means.

When the semiconductor chip C is sealed with the molding resin 4, the lead frame on which the semiconductor chip C is landed is held between a male mold in which a molding space forming recessed portion is provided for forming a body part 5 and a female mold with which the lower faces of the leads 2 have contact, and the molding resin 4 is pressed in a molding space formed by the male mold and the female mold in the state that the lower faces of the leads 2 have contact with the upper face of the female mold to form the body part 5. As a result, the lower faces of the leads are exposed to the lower face side of the body part in the same plane as the lower face thereof.

After the body part 5 is formed with the molding resin 4, the leads 2 extending from the body part 5 are cut along the side edge of the body part 5 and separated from the lead frame. Then, connection plated coatings such as those of solder plating to be connected to respective connection terminals of a mounted board are formed on the lower face sides of the leads 2 to form a complete product of the QFN semiconductor electronic parts A. It is acceptable that the process for separation from the lead frame and the plating process are reversed. FIG. 1 shows the QFN semiconductor electronic parts A before the plating process.

Figure 2A:
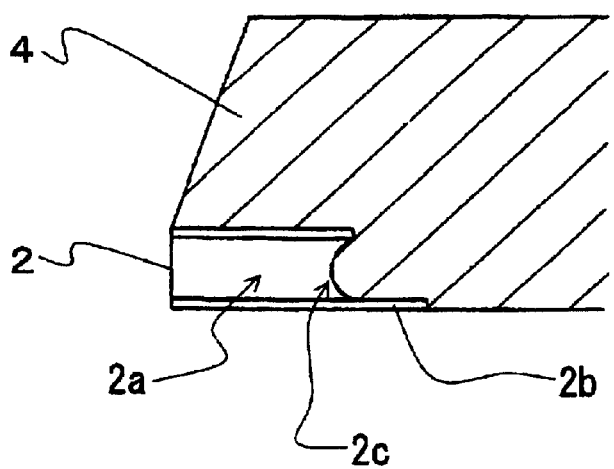
FIG. 2 is (a) a side view of the lead frame according to the present invention and (b) a front view of the lead frame.
Figure 2B:
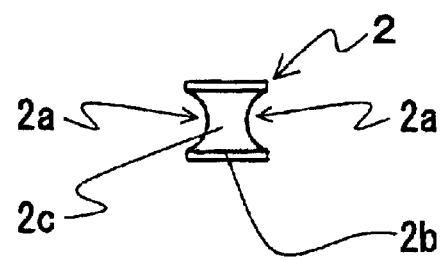

Recessed resin engaging cavities 2a, 2a are provided at both side faces of each of the leads 2, as shown in FIG. 2 with a side view and a front view, and each of the leads is formed in approximately laid H-shape longitudinal section, as shown in FIG. 2(b). Since the molding resin engaging cavities 2a, 2a are provided, during sealing the semiconductor chip C with the molding resin 4, the pressed-in molding resin 4 is also pressed in the molding resin engaging cavities 2a, 2a, whereby the force of pushing the lead 2 down to the direction of the female mold can be generated and the formation of gaps between the lower face of the lead 2 and the upper face of the female mold can be suppressed.

Since the recessed molding resin engaging cavities 2a, 2a are provided at both side faces of each of the leads 2, the hardened molding resin 4 and the leads 2 are put in an each other engaging condition at the molding resin engaging cavities 2a, 2a, thus improving adherence between the lead 2 and the molding resin 4.

Furthermore, protruded thrust extension members 2b which make the lower faces of the leads 2 extend in the extending direction of the leads 2 and which are thinner than the leads 2 are provided at the end of each of the leads 2. The thrust extension members 2b are easy to deflect because of being thinner than the leas 2. During sealing the semiconductor chip C with the molding resin 4, the thrusting extension members 2b are pushed down by the pressed-in molding resin 4 concurrently with the press-in of the molding resin 4 and easily deflected, and they can adhere to the upper face of the female mold without producing a clearance. Therefore, the formation of resin burrs at the ends of the leads 2 is prevented.

With the ends of the leads 2 easily contacting the upper face of the female mold concurrently with the press-in of the molding resin 4, the lower faces of the whole leads 2 can easily contact the upper face of the female mold. Therefore, the formation of the resin burrs even in other areas than the ends of the leads 2 is prevented.

Since the thrust extension members 2b are provided, a contact area between a base supporting the leads 2 and the lower face of the lead 2 can be increased in the wire-bonding process with the gold wires 3. Therefore, stable and reliable bonding between the gold wire 3 and the lead 2 is achieved without causing the displacement or torsion of the leads 2.

The leads 2 in this embodiment, as shown in FIG. 2(a), have the ends curved and recessed at their connections to the thrust extension members 2b to form end recessed portions 2c. The formation of the end recessed portions 2c is helpful in engagement of the molding resin 4 with the leads 2 not only at the molding resin engaging cavities 2a, 2a but also at the end recessed portions 2c.

Figure 3A:
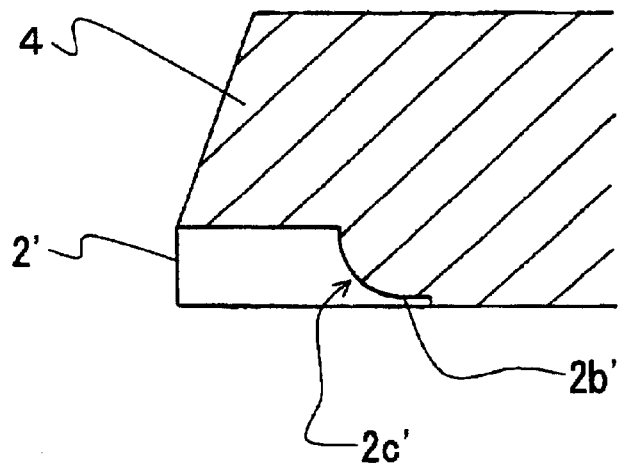
FIG. 3 is (a) a side view of the lead frame according to the present invention and (b) a front view of the lead frame.
Figure 3B:
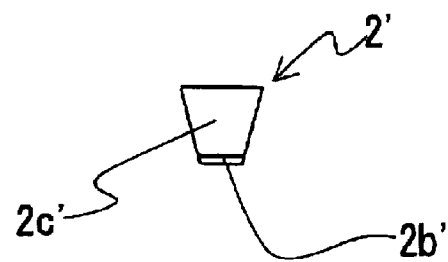

FIG. 3 shows a side view and a front view of leads 2' in another embodiment. Each of the leads 2' is formed in inverted trapezoidal cross section with its upper face being wider than its lower face. Protruded thrust extension members 2b' which make the lower faces of the leads 2' extend in the extending direction of the leads 2' and which are thinner than the leads 2' are provided at the end of each of the leads 2'. Since the thrust extension members 2b' are thinner than the leads 2', during sealing the semiconductor chip C with the molding resin 4, the thrust extension members 2b' are pushed down by the pressed-in molding resin 4 concurrently with the press-in of the molding resin 4 and easily deflected, as described above, and they can adhere to the upper face of the female mold without producing a clearance. Therefore, the formation of the resin burrs at the ends of the leads 2' is prevented.

Since each of the leads 2' is formed in inverted trapezoidal cross section with its upper face being wider than its lower face, during sealing the semiconductor chip C with the molding resin 4, the leads 2' are easily pushed down and furthermore the leads 2' serve as tenons to be fitted into mortises formed by the molding resin after the molding resin is hardened. Therefore, adherence between the lead 2' and the molding resin is improved.

The leads 2' in this embodiment, as shown in FIG. 3(a), have the ends recessed in approximately circular shape at their connections to the thrust extension members 2b' to form end curved portions 2c'. The formation of the end curved portions 2c' is helpful in quickly thrusting the thrust extension members 2b' with the pressed-in molding resin 4 during sealing the semiconductor chip C with the molding resin 4 and in making the lower faces of the thrust extension members 2b' contact the upper face of the female mold before the entry of the molding resin between the lower face of the thrust extension member 2b' and the upper face of the female mold. Therefore, the formation of the resin burrs is suppressed.

EFFECTS OF THE INVENTION

In one aspect of the present invention, the protruded molding rein engaging cavities are provided at both side faces of each of the leads to form each of the leads in approximately laid H-shape cross section. Accordingly, during sealing a semiconductor chip with a molding resin, the pressed-in molding resin is also pressed in the molding resin engaging cavities, whereby the force of pushing the leads down to the direction of the female mold can be generated to suppress the formation of the gaps between the lower face of the lead and the upper face of the female mold and thus prevent the formation of the resin burrs. Furthermore, after the molding resin is hardened, the hardened molding resin and the leads are put in an each other engaging condition in the areas of the molding resin engaging cavities, improving adherence between the molding resin and the lead.

In another aspect of the present invention, each of leads is formed in inverted trapezoidal cross section with its upper face being wider than its lower face. Accordingly, during sealing the semiconductor chip with the molding resin, the pressed-in molding resin itself becomes a resistant fluid to preclude the upward movement of the large-area upper faces of the leads, with the result that the leads are positively pushed down to suppress the formation of the gaps between the lower face of the lead and the upper face of the female mold and thus prevent the formation of the resin burrs. The leads serve as tenons to be fitted into mortises formed by the molding resin after the molding resin is hardened. Therefore, adherence between the lead and the molding resin is improved.

In another aspect of the present invention, the protruded thrust extension members which make the lower faces of the leads extend to the extending direction of the leads and which are thinner than the leads are provided at the end of each of the leads. Accordingly, during sealing the semiconductor chip with the molding resin, the thrust extension members are pushed down by the pressed-in molding resin concurrently with the press-in of the molding resin and easily deflected, and they can adhere to the upper face of the female mold without producing a clearance. Therefore, the formation of the resin burrs at the ends of the leads is prevented.

What is claimed is:

1. A lead frame for semiconductor electronic parts comprising an island adapted to land a semiconductor chip thereon and a plurality of leads provided around the peripheral edge of the island and adapted to be connected to respective electrode pads of the semiconductor chip landed on the island via conducting means, the lead frame having a body part formed with a molding resin by landing the semiconductor chip on the island, connecting the leads to the respective electrode pads of the semiconductor chip via the conducting means and sealing the semiconductor chip with the molding resin and a junction part to a mounted board formed by exposing the lower faces of the leads to the lower face of the body part, wherein each of the leads is provided with a recessed molding resin engaging cavity on each opposing side face thereof such that the leads have an approximately laid H-shape cross section and each of the leads has the lower face extending toward the semiconductor chip such that the lower face of the lead is longer than an upper face.

2. The lead frame of claim 1 wherein each of the leads has a projecting bottom portion extending from an end of the lead toward the semiconductor chip such that the lower face of the lead is longer than the upper face and the projecting bottom portion is thinner than a remainder of the lead.

* * * * *